United States Patent
Beeson

(10) Patent No.: US 7,394,322 B2
(45) Date of Patent: Jul. 1, 2008

(54) PHASE LOCKED LOOP

(75) Inventor: Peter Beeson, Oxon (GB)

(73) Assignee: Nokia Corporation, Espoo (FI)

( * ) Notice: Subject to any disclaimer, the term of this patent is extended or adjusted under 35 U.S.C. 154(b) by 158 days.

(21) Appl. No.: 10/540,961

(22) PCT Filed: Dec. 19, 2003

(86) PCT No.: PCT/IB03/06444

§ 371 (c)(1),
(2), (4) Date: Jan. 13, 2006

(87) PCT Pub. No.: WO2004/059844

PCT Pub. Date: Jul. 15, 2004

(65) Prior Publication Data

US 2006/0139103 A1    Jun. 29, 2006

(30) Foreign Application Priority Data

Dec. 30, 2002 (GB) ................................ 0230289.1

(51) Int. Cl.
*H03L 7/00* (2006.01)

(52) U.S. Cl. .................... 331/16; 331/34; 331/177 R

(58) Field of Classification Search ............. 331/16, 331/34, 177 R
See application file for complete search history.

(56) References Cited

U.S. PATENT DOCUMENTS

| 6,121,811 A | 9/2000 | Scott et al. | 327/276 |
| 6,356,122 B2 * | 3/2002 | Sevalia et al. | 327/105 |

FOREIGN PATENT DOCUMENTS

JP 09-062222 3/1997

* cited by examiner

*Primary Examiner*—Arnold Kinkead
(74) *Attorney, Agent, or Firm*—Harrington & Smith, PC

(57) ABSTRACT

A phase locked loop circuit, for providing an oscillating output signal at an output frequency, including: a reference counter; a loop counter; a phase detector having a first input coupled to the reference counter and a second input coupled to the loop counter; a voltage controlled oscillator having an input coupled to the output of the phase detector and an output for providing the oscillating output signal; a feedback loop coupling the output of the voltage controlled oscillator to the input of the loop counter; and delay circuitry, including a feedback loop, arranged to introduce a discrete delay into the output of the loop counter and/or the reference counter.

36 Claims, 3 Drawing Sheets

Signal timing diagram

PHASE LOCKED LOOP

FIELD OF THE INVENTION

Embodiments of the present invention relate to phase locked loops.

BACKGROUND TO THE INVENTION

FIG. 1 illustrates a typical phase locked loop (PLL) 10. The PLL comprises in order: a reference oscillator 12, a reference counter 14, a phase detector 16, a loop filter 18, a voltage controlled oscillator 20, and a feedback loop 22 from the VCO 20 through a loop counter 24 to the phase detector 16.

Reference oscillator supplies a reference frequency signal 21, having a frequency Fref, to the reference counter 14. The reference counter operates as a divider and produces an output pulse when it has counted M input pulses of the reference frequency signal 21. The value of M can be varied via an input control signal 23. Thus the first counter produces a reduced frequency input signal 25 which has a frequency 1/M Fref.

The phase detector 16 receives the reduced frequency input signal 25 at one input and a reduced frequency output signal 27 at the other input. The output signal 29 from the phase detector passes through the loop filter 18 to provide an input voltage signal 31 to the VCO 20. The loop filter is generally a series combination of a resistor and a capacitor connected from a node, in the connection between the phase detector 16 and the VCO 20, to ground. The loop filter may alternatively include a second capacitor connected in parallel with the resistor, or in parallel with the resistor-capacitor combination. The VCO 20 converts the input voltage signal 31 to an oscillating output signal 33 at frequency Fout.

The oscillating output signal 33 is fed to loop 22, where it is input to the loop counter 24. The loop counter 24 operates as a divider producing an output pulse when it has counted N input pulses of the oscillating output signal 33. The value of N can be varied via an input control signal 35. Thus the second counter provides as a second input to the phase detector 16, a reduced frequency output signal 27 which has a frequency 1/N Fout.

When the reduced frequency output signal 27 lags the reduced frequency input signal 25, the phase detector 16 sources current to the loop filter 18 and the voltage input to the VCO 20 rises. The VCO 20 increases the frequency Fout of the oscillating output signal 33 and the reduced frequency output signal, which reduces the lag.

When the reduced frequency output signal 27 leads the reduced frequency input signal 25, the phase detector 16 sinks current from the loop filter 18 and the voltage input to the VCO 20 drops. The VCO 20 decreases the frequency Fout of the oscillating output signal 33 and the reduced frequency output signal, which reduces the lead.

Consequently, the loop moves towards 'lock' at which Fout=Fref*N/M

Such phase locked loops suffer from a number of problems. One problem is a long settling time after a change in frequency which may make it unsuitable for modern multi-slot communication systems, in which changes in frequency occur at higher rates than in non multi-slot communication systems. For example in General Packet Radio System (GPRS) the PLL at a terminal needs to change frequency every slot.

Another problem is the PLL's susceptibility to phase noise as the sensitivity of the VCO increases. The current trend is towards using low operational voltages and VCO sensitivity must be increased if the same frequency range of output is required from lower operational voltages (e.g. 3V and below).

The sensitivity of the VCO may also be increased to accommodate frequency overshoot during a frequency change.

It would be desirable to provide an improved phase locked loop.

BRIEF DESCRIPTION OF THE INVENTION

According to one aspect of the present invention there is provided a phase locked loop circuit, for providing an oscillating output signal at an output frequency, comprising: a reference counter; a loop counter; a phase detector having a first input coupled to the reference counter and a second input coupled to the loop counter; a voltage controlled oscillator having an input coupled to the output of the phase detector and an output for providing the oscillating output signal; a feedback loop coupling the output of the voltage controlled oscillator to the input of the loop counter; and delay circuitry arranged to introduce a discrete delay into the output of the loop counter and/or the reference counter.

The delay circuit may additionally comprise a variable delay component for introducing a continuously variable delay into the output of the loop counter and/or the reference counter.

The invention allows the loop filter to be advantageously modified. The loop filter, connected to a node between the phase detector and the voltage controlled oscillator, no longer needs to include a series combination of resistor and capacitor. The loop filter may consist of a single, low value capacitor. The reduced capacitance results in an improved settling time.

According to another aspect of the present invention there is provided a method of changing the frequency of an oscillating output signal comprising the steps of: adapting the reference counter and/or the loop counter of a phase locked loop; and introducing a discrete delay into the output of the loop counter and/or the reference counter.

The method may also have the step of introducing a continuously variable delay into the output of the loop counter and/or the reference counter. A temporary variation of the discrete delay may result in a corresponding permanent variation in the variable delay.

According to a further aspect of the present invention there is provided a frequency synthesiser, for providing an oscillating output signal at an output frequency, comprising frequency compensation means arranged to maintain the output frequency and phase delay means arranged to vary discretely the phase of an input signal provided to the compensation means.

The phase delay means may additionally continuously vary the phase delay of the first input signal or, as an alternative, the second input signal.

Embodiments of the invention reduce any frequency over shoot when the output frequency is changed. This allows voltage controlled oscillators of reduced frequency sensitivity to be used. Therefore, a lower sensitivity VCO can be used, which advantageously reduces phase noise.

The use of both a variable delay and a discrete delay, allows the introduction of a large delay without having to have a mechanism for introducing a large continuous delay. The variable delay component can therefore operate over a reduced time delay range, which means that it can have a reduced sensitivity and therefore is less susceptible to introducing phase noise.

BRIEF DESCRIPTION OF THE DRAWINGS

For a better understanding of the present invention reference will now be made by way of example only to the accompanying drawings in which.

DETAILED DESCRIPTION OF EMBODIMENTS OF THE INVENTION

Figure 2:
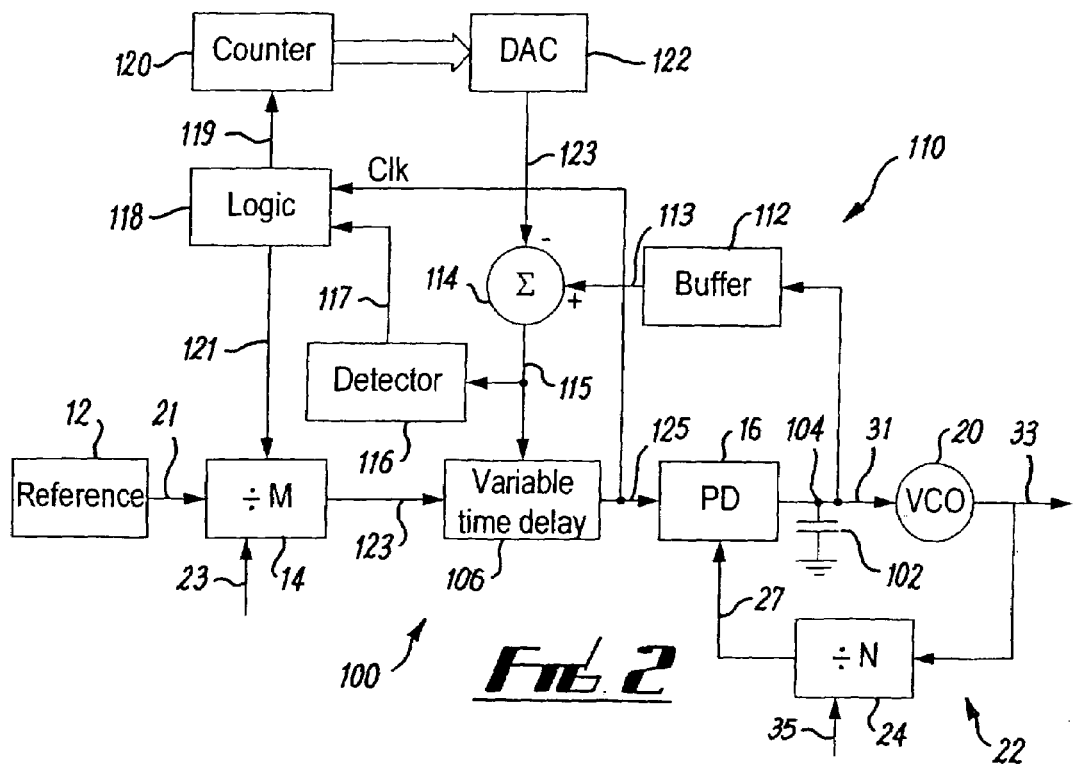
FIG. 2 illustrates an adapted phase locked loop according to one embodiment of the present invention.

FIG. 2 illustrates an adapted phase locked loop (PLL) 100 with a delay locked loop (DLL) wrapped around the phase detector 16.

Figure 1:
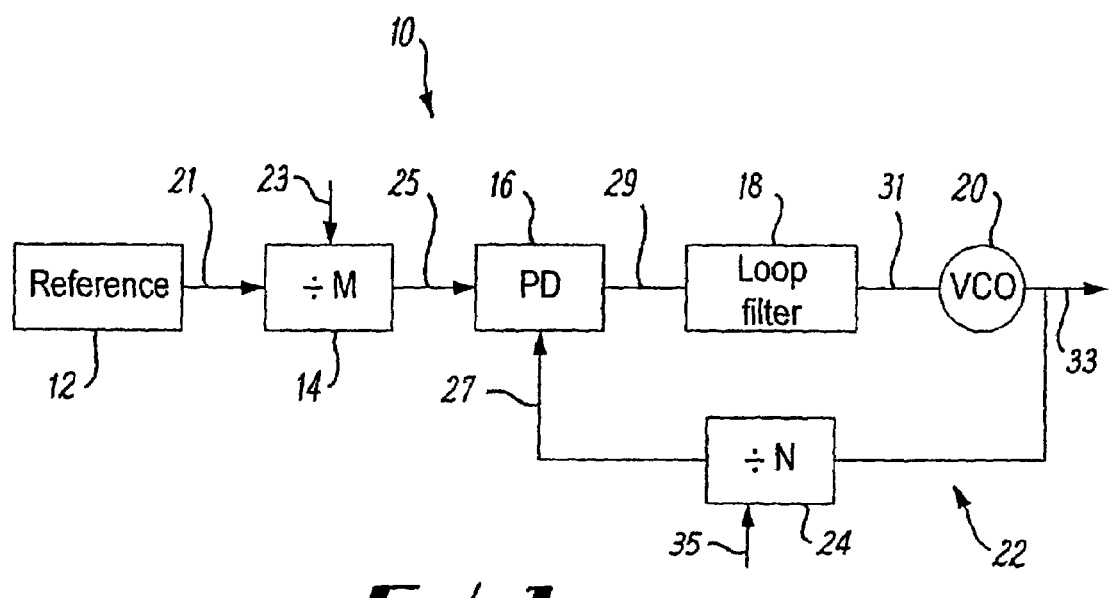
FIG. 1 illustrates a prior art phase locked loop.

The adapted PLL 100 differs from the PLL 10 of FIG. 1 in that:

a) the multi-component loop filter has been replaced by a simplified loop filter, which in this example comprises a single capacitor 102 connected between a node 104, between the phase detector 16 and the VCO 20, and ground.

b) it additionally has a variable delay component 106 connected between the first counter 14 and the phase detector 16 c) it has a feedback path from the phase detector 16 back to the variable delay component 106 and the reference counter 14 so as to form a delay locked loop (DLL) 110 wrapped around the phase detector 16. The feedback path takes as an input the output of the phase detector 16, and provides a first delay control signal 121 to the reference counter 14 and provides a second delay control signal 115 to the variable delay component 106.

The adapted phase locked loop (PLL) 100 comprises in order: the reference oscillator 12, the reference counter 14, the variable delay component 106, the phase detector 16, a loop filter in the form of a single capacitor 102, a negative feed-back loop from the phase detector 16 to the variable delay component 106 and the first counter 14, that completes the DLL 110, a voltage controlled oscillator 20, and a negative feedback loop 22 from the VCO 20 output through the loop counter 24 to the phase detector 16, that completes the basic PLL.

The reference oscillator 12 supplies a reference frequency signal 21 to the reference counter 14. The reference counter 14 keeps a counter value m which is incremented once for each received pulse of the reference frequency signal 21. When the counter value m equals a programmed value M, the reference counter 14 produces an output pulse and the counter value m is reset. The reference counter divides the frequency of the reference signal 21 by M. The value of M is programmed via the first input control signal 23.

The value of m can be controlled by the first delay control signal 121. A variation of m produces a temporary compensation in the frequency of the signal produced by the reference counter 14. The compensation of the frequency only lasts for one input pulse cycle because M is not varied and is therefore 'temporary'. The reference counter 14 can therefore be controlled to introduce delays in a discrete manner. These delays may be positive or negative. A negative delay corresponds to an advance. The delayed signal output by the reference counter, the partially compensated signal 123, is further delayed by the variable delay component 106 to produce a fully compensated signal 125, which is input to the phase detector 16.

The variable delay component adds a continuously variable delay to the partially compensated signal 123 to create the fully compensated signal 125. The value of the continuously variable delay is controlled by a second input control signal 115 from the DLL 110.

The reference counter 14 provides, gross or coarse variations in the delay in a digital all or nothing manner. The variable delay component provides an analogue variation of the delay which can be used for fine tuning. The presence of a mechanism for introducing gross delays enables the delay range of the variable delay component and therefore its sensitivity to be limited. This reduces phase noise.

The phase detector 16 receives the fully compensated signal 125 at a first input and a reduced frequency output signal 27 at the second input. The output signal from the phase detector provides an input voltage signal 31 to the VCO 20. The VCO converts the input voltage signal 31 to an oscillating output signal 33 at frequency Fout.

The oscillating output signal 33 is fed to loop 22, where it is input to the second counter 24. The second counter produces a reduced frequency output signal 27 which has a frequency 1/N Fout.

When the reduced frequency output signal 27 lags the fully compensated signal 125, the phase detector 16 sources current to the capacitor 102 and the voltage input to the VCO 20 rises. The VCO 20 increases the frequency Fout of the oscillating output signal 33 and the reduced frequency output signal 27, which reduces the lag.

When the reduced frequency output signal 27 leads the fully compensated signal 125, the phase detector 16 sinks current from the capacitor 102 and the voltage input to the VCO 20 drops. The VCO 20 decreases the frequency Fout of the oscillating output signal 33 and the reduced frequency output signal 27, which reduces the lead.

The DLL 110 comprises: a high input impedance buffer 112; a subtractor 114; a detector 116; a logic controller 118; a gross delay counter 120; and a digital to analogue converter (DAC) 122.

The high input impedance buffer 112 is connected to node 104 and receives as an input the input voltage signal 31 that is also provided to the VCO 20. The high impedance buffer may be, as in this example, a simple op amp follower which presents a high impedance to node 104.

The subtractor 114 receives from the high impedance buffer 112 a buffered voltage signal 113 and subtracts from it an output analogue signal 123 from the DAC 122, to produce the second input control signal 115 that is provided as an input to the variable delay component 106.

The detector 116 is connected to the output of the subtractor 114. It detects when the second input control signal 115 exceeds any one of a plurality of programmed thresholds. The detector provides a detection signal 117 to the logic controller 118 when a threshold is exceeded indicating that threshold.

The logic controller 118 responds to the detection signal 117 to produce a first input control signal 121 that is provided to the first counter 14 and a corresponding counter control signal 119 that is provided to the gross delay counter 120. The value of the gross delay counter 120 is converted from a digital to an analogue value by the DAC 122 and provided as the output signal 123 to the subtracting input to the subtractor 114.

The DLL 110 operates as a feed-back loop to control the delay introduced by the reference counter 14 and variable delay component 106.

The frequency of the oscillating output signal 33 is generally changed by reprogramming the value of N in the loop counter 24. The value of N can be varied via an input control signal 35.

If N is increased, the reduced frequency output signal 27 starts to lag the fully compensated signal 125 and the phase detector 16 acts to increase the voltage 31, which, in turn, increases Fout. The increasing input voltage signal 31 increases via the buffer 112 and the subtractor 114, the second input control signal 115. This introduces a positive delay (a phase lag) into the fully compensated signal 125 via the variable delay component 106. Consequently, the amount by which the reduced frequency output signal 27 lags the fully compensated signal 125 is reduced. If the value of the introduced delay represented by the second input control signal 115 is below a threshold, then the reference counter 14 is unaffected. If the value of the introduced delay exceeds a threshold, the detector 116 detects this and informs the logic controller 118. The logic controller 118 then provides a first input control signal 121 to the reference counter 14. The signal 121 represents a number x of reference clock cycles of duration t. The value of x is a natural number dependent upon the threshold that has been exceeded. The duration x*t is such that the delay introduced via the variable delay component 106 by the second input control signal 115 is brought towards the exceeded threshold and on this cycle or a subsequent cycle within the threshold.

The reference counter subtracts the value x from its current value of its counter value m. This introduces a delay of x*t via the reference counter 14.

The signal 119 is the same as the first input control signal 121. The gross delay counter 120 is incremented by the value x. The counter therefore holds the total number of reference clock cycles of delay that have been introduced by the signal 121 via the reference counter 14. The DAC 122 converts the counter value of the gross delay counter 120 to an analogue output signal 123 whose voltage is directly proportional to the number of cycles of delay. This analogue output signal 123 is then subtracted from the buffered voltage signal 113 so as to adjust the second control signal 115. Accordingly, any increase/decrease in the gross delay counter 120 results in a directly proportional increase/decrease in the analogue output signal 123, which in turn results in a directly proportional decrease/increase to the second control signal 115. The new value of the second input control signal resets the variable delay component so that the delay introduced by it is reduced by x*t. This brings the delay introduced via the variable delay component 106 by the second input control signal 115 towards the detected threshold.

The value x may be fixed at single value such as one or more clock cycles. In other embodiments, the value of x may be one of a plurality of values that depends upon which one of a plurality of thresholds have been exceeded by the second input control signal 115. The greater the value of the threshold exceeded the greater the compensating value of x. The thresholds defined by the detector 116 may be programmed.

Figure 3:
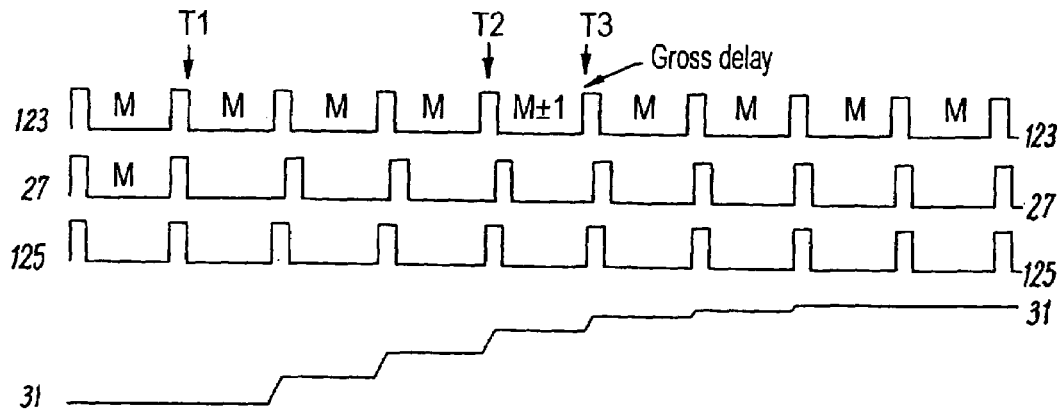
FIG. 3 is an example of one possible signal timing diagram for the phase locked loop of FIG. 2.
Figure 3:
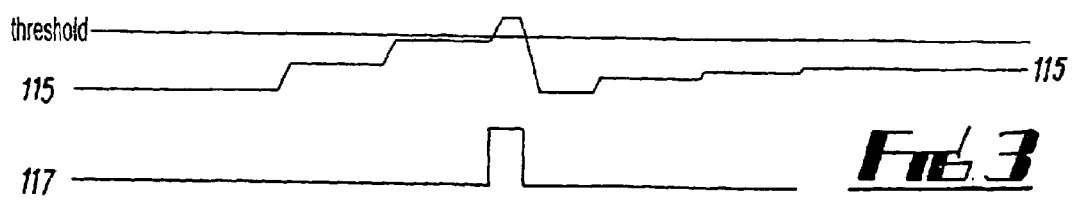

FIG. 3 illustrates a signal timing diagram for the partially compensated signal 123, the VCO input voltage signal 31, the fully compensated signal 125, the second input control signal 115 and the detection signal 117. In this illustration there is a single threshold and x=1.

The value of N is increased at time T1. At T1 frequency output signal 27 begins to lag the fully compensated signal 125. The input voltage signal 31 rises and the variable delay component introduces an increasing delay, dependent upon the input voltage signal 31. At time T2 the second input control signal 115 exceeds a threshold. As a consequence a gross delay equivalent to one reference clock cycle is introduced into the reference counter 14 and the delay introduced by the variable delay component 106 is reduced by the same amount by reducing the second input control signal 115 by means of counter 120, DAC 122 and subtractor 114. The introduction of the gross delay, equivalent to one reference clock period, into the partially compensated signal 123 can be observed at time T3. The DLL acts directly on the phase and removes the phase error, by adjusting the delay, extremely quickly.

If N is decreased, the reduced frequency output signal 27 starts to lead the fully compensated signal 125 and the voltage 31 decreases, which decreases Fout. The decreasing input voltage signal 31 decreases the second input control signal 115. This introduces a negative delay (a phase advance) into the fully compensated signal 125 via the variable delay component 106. Consequently, the amount by which the reduced frequency output signal 27 leads the fully compensated signal 125 is reduced. If the value of the introduced delay represented by the second input control signal 115 does not exceed a threshold, then the reference counter 14 is unaffected. If the value of the introduced delay exceeds a threshold, the detector 116 detects this and informs the logic controller 118. The logic controller 118 then provides a first input control signal 121 to the reference counter 14. The signal 121 represent a number −y of reference clock cycles of duration t. The value of y is a natural number dependent upon the threshold that has been exceeded. The duration −y*t is such that the delay, introduced via the variable delay component 106 by the second input control signal 115, is brought within the exceeded threshold.

The reference counter adds the value y to its current value of its counter value m. This introduces a phase advance of y*t via the reference counter 14.

The signal 119 is the same as the first input control signal 121. The gross delay counter 120 is decremented by the value y. The counter therefore holds the total number of reference clock cycles of delay that have been introduced by the signal 121 via the reference counter 14. The DAC 122 converts the counter value of the gross delay counter 120 to an analogue output signal 123 whose voltage is directly proportional to the number of cycles of delay. This analogue output signal 123 is then subtracted from the buffered voltage signal 113 so as to adjust the second control signal 115. Accordingly, any increase/decrease in the gross delay counter 120 results in a directly proportional increase/decrease in the analogue output signal 123, which in turn results in a directly proportional decrease/increase to the second control signal 115.

The value y may be fixed at single value such as one or more clock cycles. In other embodiments, the value of y may be one of a plurality of values that depends upon which one of a plurality of thresholds have been exceeded by the second input control signal 115. The greater the value of the threshold exceeded the greater the compensating value of y. The thresholds defined by the detector 116 may be programmed.

It should be appreciated that if the second control signal rises significantly above the threshold or the maximum threshold, then even after gross delay compensation at one cycle, it may still exceed the threshold in the next cycle, in which case gross delay compensation also occurs in the next cycle.

In the embodiment of FIG. 2, the DLL 110 wraps around the phase detector 16 with an input to the reference path. The variable delay component 106 is placed in the reference path between the reference counter 14 and the phase detector 16.

The DLL 110 provides an input to the reference counter 14 and the variable delay component 106.

Figure 4:
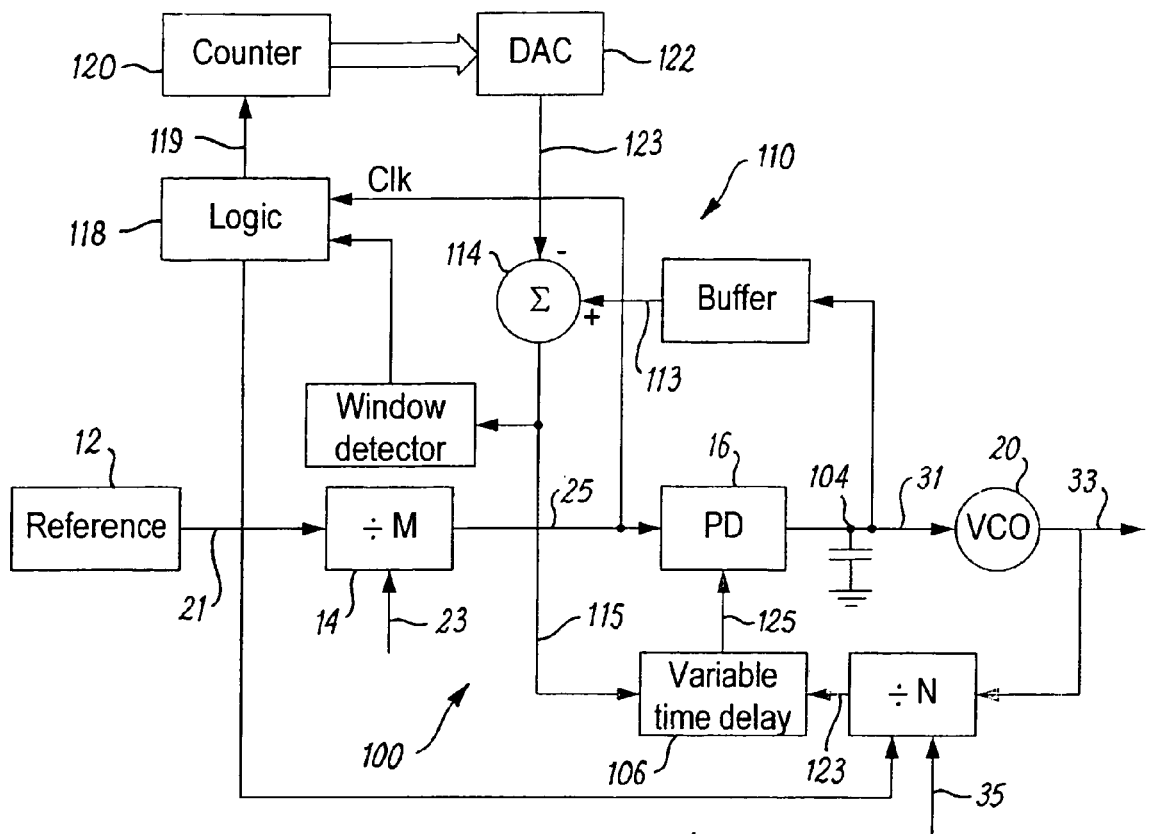
FIG. 4 illustrates an adapted phase locked loop according to a second embodiment of the present invention.

It is also possible to arrange the DLL 110 so that it wraps around the phase detector 16 with an input to the loop path of the PLL 100 as illustrated in FIG. 4. The variable delay component 106 is placed in the loop path between the loop counter 24 and the phase detector 16. The DLL 110 provides an input to the loop counter 24 and the variable delay component 106. When the delay is introduced into the loop path, the sense in which delays are added at the variable delay component 106 and the loop counter 24 is opposite to that when the delay is introduced into the reference path.

Figure 5:
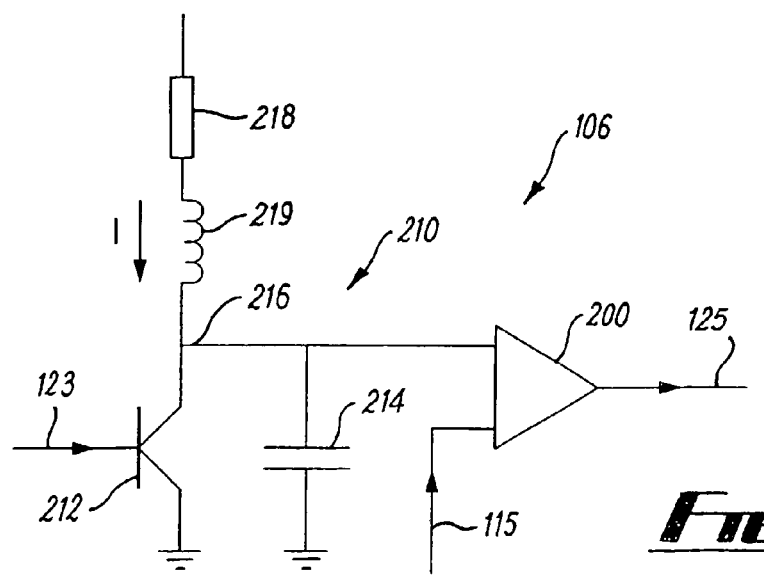
FIG. 5 illustrates one example of a variable delay component 106.

One example of a variable delay component 106 is illustrated in FIG. 5. The variable delay component 106 comprises a comparator 200 and a linear ramp generator 210. The output of the comparator 200 provides the fully compensated signal 125. One input to the comparator is the second control signal 115 and the other is from the linear ramp generator 210. The liner ramp generator 210 comprises a transistor 212 and a capacitor 214 connected in parallel between the input node 216 to the comparator 200 and ground.

The input node 216 is also connected to a series connected resistor 218 and inductor 219, which provides a constant current source. The transistor 212 receives the partially compensated signal 123 as a switching input. When the transistor 212 is switched on there is a low resistance path to earth via the transistor 212 and current flows through the resistor 218 and inductor 219 series to earth. When the transistor 212 is switched off there is a high resistance path to earth and the current flowing through the inductor 219 and resistor 218 series combination charges the capacitor 214 connected in parallel with the transistor 212. When the voltage developed by this capacitor 214 exceeds the second input control signal 11.5 value, the output of the comparator, the compensated signal 125, switches.

In the combination of the adapted PLL 100 and DLL 110, the PLL sets the frequency and the DLL 110 sets the phase. The presence of delay locked loop introduces a zero in the phase locked loop frequency response which allows the conventional loop filter of a PLL to be replaced with a low capacitance loop filter that consists in this example of a small value shunt capacitor. This is the loop filter in its simplest form. Alternatively other forms of loop filter may be used, for example, a resistor may additionally be connected in series between node 104 and the input to the VCO 20 with an additional shunt capacitor attached between the input to the VCO 20 and ground. Thus the conventional loop filter of a PLL that includes a large valued capacitance and a resistor connected in series from the node to ground is replaced by a small value capacitor. The small value of the capacitor provides a very fast settling time after a frequency step is performed.

In the above described embodiments the discrete phase compensation by the counter occurs before the variable phase compensation by the variable delay component. That is the variable delay component follows the counter. In other embodiments, the variable delay component may precede the counter so that the variable phase compensation occurs before the discrete phase compensation.

In the above described embodiments, the DLL and the PLL share the same phase detector. In other embodiments, the DLL may have its own phase detector and the PLL may have its own phase detector.

By adjusting the thresholds at which detector 116 operates, large variations in phase delay can be achieved using a variable delay component with a limited range (and sensitivity). This reduces phase noise.

Although the embodiments of the invention have been described with reference to an integer PLL, it may also be used in fractional PLLs.

The term 'phase detector' includes within its scope 'time comparator'.

It should be appreciated that the adapted PLL described above has many applications, such as controlling the transmission or receiving frequency of a radio transceiver. It may for example, be used as a frequency synthesiser to provide a carrier signal for modulation or provide a frequency or phase modulated signal. Phase or frequency modulation of the output signal 33 can be achieved by adding a modulation signal to the second input control signal 115. For larger deviations of frequency or phase a digital control signal can also be summed with the first input control signal 121.

Although embodiments of the present invention have been described in the preceding paragraphs with reference to various examples, it should be appreciated that modifications to the examples given can be made without departing from the scope of the invention as claimed.

Whilst endeavouring in the foregoing specification to draw attention to those features of the invention believed to be of particular importance it should be understood that the Applicant claims protection in respect of any patentable feature or combination of features hereinbefore referred to and/or shown in the drawings whether or not particular emphasis has been placed thereon.

I claim:

1. A phase locked loop circuit, for providing an oscillating output signal at an output frequency, comprising:
a reference counter;
a loop counter;
a phase detector having a first input coupled to the reference counter and a second input coupled to the loop counter;
a voltage controlled oscillator having an input coupled to the output of the phase detector and an output for providing the oscillating output signal;
a feedback loop coupling the output of the voltage controlled oscillator to the input of the loop counter; and
delay circuitry, including a feedback loop, arranged to introduce in response to a change in the output frequency, a discrete coarse delay into a phase of an input signal provided to the phase detector, and an analogue fine delay into the phase of the input signal wherein the coarse delay and the fine delay effect phase compensation of the input signal.

2. A phase locked loop circuit as claimed in claim 1, wherein the delay circuit temporarily introduces an off-set into the loop counter and/or the reference counter.

3. A phase locked loop circuit as claimed in claim 1, wherein the delay circuit comprises a variable delay component for introducing a continuously variable delay into the output of the loop counter and/or the reference counter.

4. A phase locked loop circuit as claimed in claim 3, wherein the delay circuitry comprises a detector for detecting when the variable delay component exceeds a threshold and control means for introducing a discrete delay in response to said detection.

5. A phase locked loop circuit as claimed in claim 3, wherein the delay circuit is arranged to compensate a variation in the discrete delay with a variation in the variable delay.

6. A phase locked loop circuit as claimed in claim 3, wherein the delay circuitry is arranged such that a maximum variable delay is substantially equal to a minimum discrete delay.

7. A phase locked loop circuit as claimed in claim 3, wherein the delay circuitry comprises a feedback loop which provides an input to the variable delay component that is dependent upon both the voltage at the input to the voltage controlled oscillator and the discrete delay introduced into the loop counter and/or the reference counter.

8. A phase locked loop circuit as claimed in claim 7, wherein the delay circuit temporarily introduces an off-set into the loop counter and/or the reference counter and comprises: a summation means for summing the introduced offsets; a digital to analogue conversion means for converting the total introduced offset into an analogue signal representing the total introduced discrete delay; and subtraction means for subtracting the analogue signal from a signal representative of the voltage at the input of the voltage controlled oscillator to produce the input to the variable delay component.

9. A phase locked loop circuit as claimed in claim 1, further comprising a shunt capacitor connected between a node between the phase detector and the voltage controlled oscillator and ground.

10. A phase locked loop circuit as claimed in claim 1, wherein the phase detector output is coupled to the input of the voltage controlled oscillator via an intervening loop filter consisting of a capacitor.

11. A frequency synthesiser comprising a phase locked loop circuit as claimed in claim 1.

12. A method of changing the frequency of an oscillating output signal comprising:
adapting the reference counter and/or the loop counter of a phase locked loop;
introducing a discrete coarse delay into the phase input of a signal provided to a frequency compensation means;
introducing an additional analogue fine delay into the phase of the input signal, wherein the coarse delay and the fine delay are introduced to effect phase compensation of the input signal in response to a change in the frequency of the oscillating output signal.

13. A method as claimed in claim 12 further comprising the step of introducing a continuously variable delay into the output of the loop counter and/or the reference counter.

14. A method as claimed in claim 13, wherein a temporary variation of the discrete delay results in a corresponding permanent variation in the variable delay.

15. A frequency synthesiser, for providing an oscillating output signal at an output frequency, comprising:
frequency compensation means arranged to maintain the output frequency; and
feedback means arranged to introduce in response to a change in the output frequency, a discrete coarse delay into a phase of an input signal provided to the compensation means, and an analogue fine delay into the phase of the input signal, wherein the coarse delay and the fine delay effect chase compensation of the input signal.

16. A frequency synthesiser as claimed in claim 15, wherein the feedback means is additionally arranged to vary continuously the phase delay of the input signal.

17. A frequency synthesiser as claimed in claim 15, wherein the compensation means comprises: an input for receiving a first input signal; comparison means for comparing the first input signal and a second input signal; control means for controlling the output frequency in dependence upon the comparison; and a negative feedback loop for providing the second input signal.

18. A frequency synthesiser as claimed in claim 17, wherein the comparison means is a phase detector.

19. A frequency synthesiser as claimed in claim 17, wherein the control means comprises a capacitor, a voltage controlled oscillator having its input connected to the capacitor and means for sourcing and sinking current to said capacitor and thereby control the output of said voltage controlled oscillator and the output frequency.

20. A frequency synthesiser as claimed in claim 17, wherein the negative feedback loop comprises programmable means for adjusting the second input signal.

21. A frequency synthesiser as claimed in claim 20, wherein the programmable means is a counter.

22. A frequency synthesiser as claimed in claim 17, wherein the feedback means is additionally arranged to continuously vary the phase delay of the first input signal.

23. A frequency synthesiser as claimed in claim 17, wherein the feedback means is additionally arranged to continuously vary the phase delay of the second input signal.

24. A frequency synthesiser as claimed in claim 22, wherein the feedback means comprises a negative feedback loop.

25. A phase locked loop circuit, for providing an oscillating output signal at an output frequency, comprising:
a reference counter;
a loop counter;
a phase detector having a first input coupled to the reference counter and a second input coupled to the loop counter;
a voltage controlled oscillator having an input coupled to the output of the phase detector and an output for providing the oscillating output signal;
a feedback loop coupling the output of the voltage controlled oscillator to the input of the loop counter; and
delay circuitry, including a feedback loop, arranged to introduce in response to a change in the output frequency, a discrete coarse delay into a phase of the first input signal provided to the phase detector, and an analogue fine delay into the phase of the first input signal wherein the coarse delay and the fine delay effect phase compensation of the first input signal.

26. A method of changing the frequency of an oscillating output signal comprising:
adapting a loop counter of a phase locked loop; and
using a feedback loop to introduce a discrete coarse delay into the phase input of a signal provided to a frequency compensation means;
introducing an additional analogue fine delay into the phase of the input signal, wherein the coarse delay and the fine delay are introduced to effect compensation of the input signal in response to a change in the frequency of the oscillating output signal.

27. A frequency synthesiser, for providing an oscillating output signal at an output frequency, comprising:
frequency compensation means comprising: an input for receiving a first input signal; comparison means for comparing the first input signal and a second input signal; control means for controlling the output frequency in dependence upon the comparison; and a negative feedback loop for providing the second input signal; and
feedback means arranged to introduce, in response to a change in the output frequency, a discrete coarse delay into the phase of the first input signal provided to the frequency compensation means and an analogue fine delay into the phase of the first input signal wherein the coarse delay and the fine delay effect phase compensation of the first input signal.

28. A frequency synthesiser as claimed in claim 27, wherein the comparison means is a phase detector.

29. A frequency synthesiser as claimed in claim 27, wherein the control means comprises a capacitor, a voltage controlled oscillator having its input connected to the capacitor and means for sourcing and sinking current to said capacitor and thereby control the output of said voltage controlled oscillator and the output frequency.

30. A frequency synthesiser as claimed in claim 27, wherein the negative feedback loop comprises programmable means for adjusting the second input signal.

31. A frequency synthesiser as claimed in claim 30, wherein the programmable means is a counter.

32. A frequency synthesiser, for providing an oscillating output signal at an output frequency, comprising:

frequency compensation means comprising: an input for receiving a first input signal; comparison means for comparing the first input signal and a second input signal; control means for controlling the output frequency in dependence upon the comparison; and a negative feedback loop for providing the second input signal; and feedback means arranged to introduce, in response to a change in the output frequency, a discrete coarse delay into the phase of the second input signal provided to the frequency compensation means and an analogue fine delay into the phase of the second input signal wherein the coarse delay and the fine delay effect phase compensation of the second input signal.

33. A frequency synthesiser as claimed in claim 32, wherein the comparison means is a phase detector.

34. A frequency synthesiser as claimed in claim 32, wherein the control means comprises a capacitor, a voltage controlled oscillator having its input connected to the capacitor and means for sourcing and sinking current to said capacitor and thereby control the output of said voltage controlled oscillator and the output frequency.

35. A frequency synthesiser as claimed in claim 32, wherein the negative feedback loop comprises programmable means for adjusting the second input signal.

36. A frequency synthesiser as claimed in claim 35, wherein the programmable means is a counter.

* * * * *